United States Patent
Soh

(10) Patent No.: US 6,855,004 B2
(45) Date of Patent: Feb. 15, 2005

(54) ELECTROSTATIC PROTECTION COVER

(75) Inventor: Lip Teck Soh, Skudai (MY)

(73) Assignee: FCI, Paris (FR)

( * ) Notice: Subject to any disclaimer, the term of this patent is extended or adjusted under 35 U.S.C. 154(b) by 25 days.

(21) Appl. No.: 10/324,923

(22) Filed: Dec. 20, 2002

(65) Prior Publication Data
US 2003/0124892 A1 Jul. 3, 2003

(30) Foreign Application Priority Data
Dec. 28, 2001 (SG) ......................................... 200108116

(51) Int. Cl.[7] .............................................. H01R 31/08
(52) U.S. Cl. ........................ 439/509; 439/41; 439/608; 439/513
(58) Field of Search ..................... 439/41–42, 509–511, 439/607–609, 513

(56) References Cited

U.S. PATENT DOCUMENTS

| | | | | |
|---|---|---|---|---|
| 5,562,489 A | * | 10/1996 | Cronin | 439/507 |
| 5,609,493 A | * | 3/1997 | Cheng et al. | 439/157 |
| 5,863,210 A | * | 1/1999 | Reisinger | 439/41 |
| 5,906,508 A | * | 5/1999 | Jeffcoat | 439/509 |
| 6,019,617 A | * | 2/2000 | Liu et al. | 439/135 |
| 6,116,949 A | * | 9/2000 | Costello et al. | 439/509 |
| 6,152,771 A | | 11/2000 | Juntwait | 439/607 |

FOREIGN PATENT DOCUMENTS

WO    WO94/00894    1/1994

* cited by examiner

Primary Examiner—Truc T. T. Nguyen
(74) Attorney, Agent, or Firm—Perman & Green, LLP

(57) ABSTRACT

An electrostatic protection cover for press fitting onto an electrical connector of a kind having at least one array of a plurality of compressive conductive elements. The electrostatic protection cover comprises a main body including an upper section to be positioned adjacent the upper surface of the electrical connector and electrically engaging contact sections of the electrical contacts. At least one grounding leg is dependent from the main body and positioned therefrom so that a resiliently deflectable portion of the at least one grounding leg can become engaged by at least one conductive element and upon engagement to be deflected from a previously undeflected condition. Clipping features are provided for removably securing the main body to the electrical connector.

15 Claims, 1 Drawing Sheet

ELECTROSTATIC PROTECTION COVER

FIELD OF THE INVENTION

The present invention relates to an electrostatic protection cover for and/or engaged with an electrical connector and wherein such a cover preferably also provides facility for suction device pick up and placement of the connector and/or the cover.

BACKGROUND OF INVENTION

The use of electrostatic protection covers for electrical connectors is common. Electrical connectors which may provide an interface and electrical connection for a plurality of circuits between two electrical devices are typified by for example U.S. Pat. No. 6,116,949. Such a connector is normally engaged to a lower printed circuit board and presents conductive elements to be engaged by an electrical device such as another printed circuit board, PC card. The connector allows for an electrical connection to be made between circuits provided by the lower printed circuit board and the upper device. Prior to such an upper device being engaged with the connector it can be important that direct contact with individual conductive elements of the connector is voided. Such contact for example by a person, may be sufficient for electrostatic discharge to occur from the person to some of the conductive elements thereby establishing a flow of electricity through the lower printed circuit board. This may be detrimental to the integrity of the electrical device. Accordingly it is desirable for an electrical connector to be presented before use in a protective manner wherein a grounding of all of the conductive elements is able to be provided so that the effect of any electrostatic discharge is minimised, reduced or eliminated.

U.S. Pat. No. 6,116,949 illustrates a protective cover for an electrical connector which consists of a conductive sheet metal material able to engage directly with all of the conductive element simultaneously. The device also presents an upper surface of a kind which allows for a machine engagement to be made with the protective cover for a machine handling of the cover and connector.

As the type of connector with which such an electrostatic protection cover is engaged is of a compressive connection kind (meaning that the conductive elements are compressed upon engagement of the upper electric device to ensure that a good connection is created) the electrostatic cover can take advantage of this compressive connection feature in generating a good connection between the cover and the conductive elements. However with the type of cover as shown in U.S. Pat. No. 6,116,949, all of the conductive elements engage simultaneously with a substantially rigid region of the cover. Depending on the number of conductive elements presented from the connector, the downward pressure required to be provided by the cover for engagement to the connector can be undesirably large. The force for applying and retaining such prior art covers is transmitted directly between the pin contact regions of the connector. Such a large force can be undesirable in that it can cause damage to the electrical conductors or create distortion and bending of the lower circuit board during the engagement of the electrostatic protection cover. Likewise, in order to ensure the cover remains engaged with the connector a strong clipping force is required which, when the cover is to be removed, needs to be overcome. The cover can hence also cause undesirable effects during its removal.

Accordingly it is an object of the present invention to provide an electrostatic protection cover which overcomes at least the abovementioned disadvantages or which will at least provide the public with a useful choice.

BRIEF DESCRIPTION OF THE INVENTION

In a first aspect the present invention consists in an electrostatic protection cover for press fitting onto an electrical connector of a kind having at least one array of a plurality of compressive conductive elements said electrostatic protection cover comprising:

a main body including an upper section to be positioned adjacent the upper surface of said electrical connector and electrically engaging contact sections of the electrical contacts, at least one grounding leg dependent from said main body and positioned therefrom so that a resiliently deflectable portion of said at least one grounding leg can become engaged by at least one conductive element and upon engagement to be deflected from a previously undeflected condition clipping means for removably securing said main body to said electrical connector.

Preferably said clipping means includes at least two resilient legs extending from said main body each for engagement with an opposite side of the electrical connector.

Preferably said clipping means includes a further pair of legs extending downwardly from the upper section of said main body to engage with a further pair of legs receiving region of the upper surface of said electrical connector.

Preferably said at least two resilient legs are to locate said main body in a direction lateral to the direction in which said further pair of legs provides location of said main body when viewed in a direction downwardly onto said electrostatic protection cover.

Preferably said at least two resilient legs are downwardly dependent from said main body and have an outwardly splayed (relative to each other) distal end.

Preferably the main body section includes said upper section of a substantially quadrilateral outline and side sections extending from opposed sides of said upper section thereby forming a U-shaped profile.

Preferably a plurality of grounding legs are provided, one for a respective conductive element, and each extending from a said side section in a cantilevered manner each having a fixed end engaged to said side section and a distal end.

Preferably said plurality of grounding legs extend from both said side sections.

Preferably the distal ends of said plurality of grounding legs from both side sections are positioned inwardly of said U-shaped profile.

Preferably said at least one grounding leg is positioned to engage with externally presented contact regions of each said conductive element.

Preferably said side sections are engaged with said upper section at both distal ends of said sides.

Preferably said connector has been formed by bending from a stamped sheet metal material.

Preferably said upper section includes a planar region with which a suction pressure pick-up tool can engage for the machine handling of said connector.

In a second aspect the present invention consists in an electrical connector of a kind having at least one array of a plurality of conductive elements located by an insulating housing for providing an electrical connection between electrical circuit traces of two electrical devices wherein said electrical connector has an electrostatic protection cover engaged thereto, to create a short between all conducive elements, said electrostatic protection cover comprising a main body including an upper section to be positioned adjacent the upper surface of said electrical connector and electrically connected to contact sections of the electrical contacts, at least one grounding leg dependent from said main body in a resiliently deflectable manner, each engaged by an at least one conductive element and biased thereto as a result of having been deflected clipping means for removably securing said main body to said electrical connector.

This invention may also be said broadly to consist in the parts, elements and features referred to or indicated in the specification of the application, individually or collectively, and any or all combinations of any two or more of said parts, elements or features, and where specific integers are mentioned herein which have known equivalents in the art to which this invention relates, such known equivalents are deemed to be incorporated herein as if individually set forth.

DETAILED DESCRIPTION OF THE INVENTION

Figure 1:
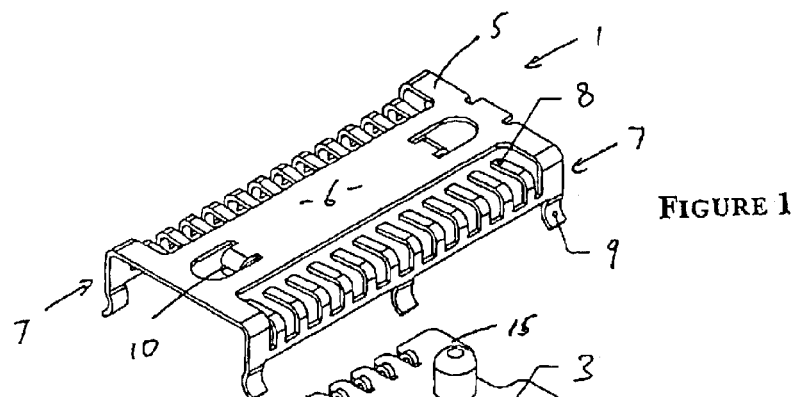
FIG. 1 is a perspective view of an electrostatic protection cover of the present invention before engagement with a connector.

With reference to FIG. 1, a preferred form of the electrostatic protection cover 1 is shown. The cover is of a kind which is engageable to a connector as for example shown in FIG. 2. The connector 2 is engaged or engageable to a lower printed circuit board (not shown) or other electrical device and provides a plurality of conductive elements 4 which each engage to an electrical trace of the printed circuit board at one region thereof and present a contact region 3 for engagement with electrical traces of an upper electrical device (not shown) to be engaged therewith.

Figure 2:
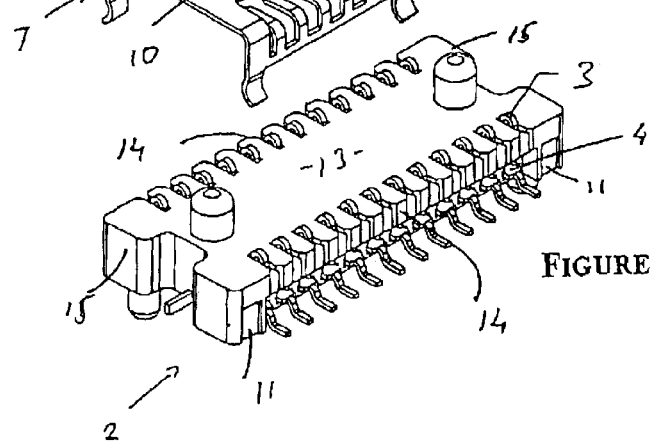
FIG. 2 is a perspective view of a connector with which the electrostatic protection cover of FIG. 1 is able to engage.

The electrical connector 2 has an upper region 13, side region 14 and end region 15 and locates a plurality of conductive elements 4 normally in an array or two arrays as for example shown in FIG. 2. Each conductive element can provide a connection of separate electrical traces between the upper and lower electrical devices. The connector is of a kind which presents the conductive elements so that they are compressive in nature upon engagement of the upper device with the connector. The connector may be formed by bending from a stamped sheet metal material. The upper contact region 3 is deflected downwardly when the upper device is engaged for use with the connector and are then biased towards the upper device to ensure good connectivity is created. The connector of the present invention may come in the form as for example shown in FIG. 2 or may alternately be pre-applied to a printed circuit board.

The electrostatic protection cover 1 is engageable to the connector but is removable therefrom immediately prior to the connector being used for providing electrical connection between the lower and upper electrical devices. The cover 1 is an integral member of a conductive material such as a metal and provides a short between each of the conductive elements of the connector when engaged with the connector. It is preferably of a metal which has good resistance to plastic deformation. The cover is releasably engaged with the connector wherein the application and removal of the cover is in an up/down direction relative to the connector. The cover is engaged with the connector by a pressing action and contact of the cover with the conductive elements is achieved in a compressive manner.

The cover consists of a main body 5 which includes an upper section 6 and side section 7. The side section 7 extends from opposite sides of the upper region 6 substantially downwardly therefrom. The effect is to provide in side view a substantially U shaped cover.

Presented from the main body are a plurality of legs 8 which are engaged from the main body in a cantilevered arrangement so that they provide a region engageable with individual conductive elements in a resiliently deflectable manner. As shown in FIG. 1, the legs extend from the side sections of the main body and extend inwardly in respect of the U section shaped cover. The legs 8 have preferably a distal end 16 which is resiliently displaceable. At or between the distal end and the cantilevered end, the legs are to make contact with for example the upper contact region 3 of the conductive elements 4. Each leg of the cover may be provided to engage with at least one conductive element of the connector. Indeed in the most preferred form a leg is provided for connection with one conductive element only.

Figure 5:
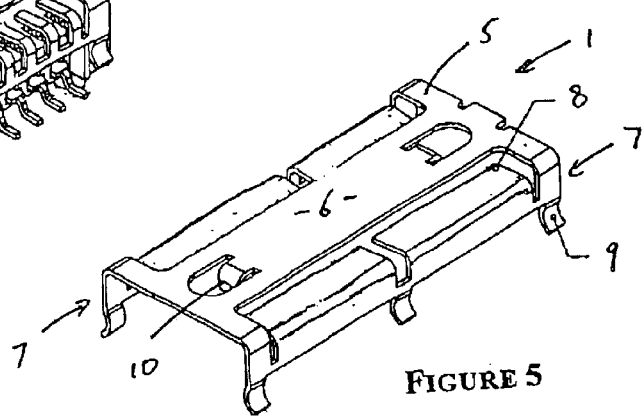
FIG. 5 is a perspective view of a cover wherein individual legs are provided for engagement with several conductive elements.

FIG. 5 shows a leg engaged with several conductive elements. The legs are still independently deflectable relative to the upper section and the clipping feature but perhaps of a more rigid form.

The connector 1 also includes clipping features such as provided by legs 9 and 10. The legs 9 preferably extend from the main body on the side section thereof to be engaged with leg receiving regions 11 with which they can engage in a clip or snap fit arrangement. The legs 9 are preferably provided with outwardly splayed distal ends so that a convenient engagement of the cover can be provided with the connector. Likewise the legs 10 can be provided to engage with a connection region 12 of the connector which may be provided at an upper region thereof. The legs 10 may be provided as a snap or clip fit features or alternatively may be provided merely as a location means to locate the cover relative to the connector in the longitudinal direction (the direction to which both the upper and side sections of the body portion are parallel to). Preferably this longitudinal direction is transverse to the direction to which the legs 9 locate the cover with the connector. The legs 10 may be provided in a resiliently deflectable manner from the upper section of the main body so that a rigid location of the cover with the connector can be provided by such legs.

Figure 4:
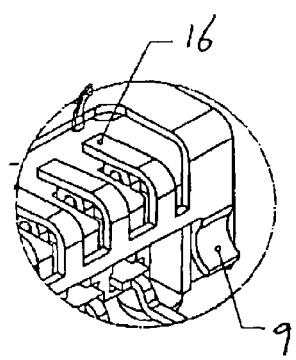
FIG. 4 is a detailed view of part of the electrostatic protection cover and connector in an engaged condition.
Figure 3:
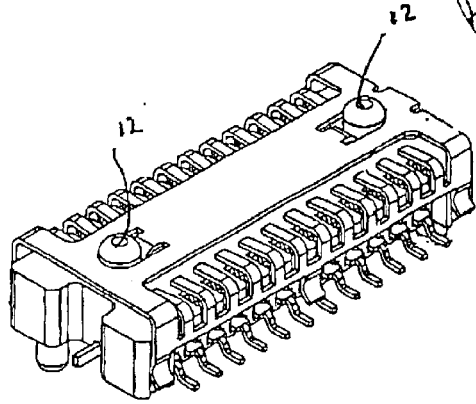
FIG. 3 is a perspective view of the electrostatic protection cover and the connector of FIGS. 1 and 2 in an engaged condition.

In moving to the fully engaged condition of the cover with the connector, the legs 8 make contact with the conductive elements and are deflected upwardly (as indicated by the arrow shown in FIG. 4) relative to the main body. Such upward deflection of each leg 8 is independent from the legs 9 and 10. As the legs 8 are able to deflect upward during the movement of the cover downwardly onto the connector, the force that is transmitted to the legs 8 is reduced and hence the force that the legs apply onto the conductive elements is also reduced. This in turn will reduce the likelihood of damage occurring to the conductive elements as they experience a reduced contact force by the legs 8.

As the legs 8 are flexible relative to the main body of the cover, they will make contact with the conductive elements at all times with a light force. Such a light application force will reduce any large deflection of the conductive elements and hence reduce the possibility of their damage. Since the force experienced by the legs 8 is largely localised the retention features are able to act independently on the connector.

It is to be appreciated that the legs 8 may be provided in a different form which is appropriate to the particular design of connector it is to engage with. Some connector may present conductive elements where the lower terminals are engaged onto a PCB and the upper terminals are presented for compression engagement in a sideways (parallel to the PCB) direction as opposed to a downward direction.

The legs 8 may hence be presented from the body portion of the cover to be deflected side ways.

The benefit is that it prevents any unnecessary stress being applied to the compressible conductive elements before actual application and the retention force required to retain the cover to the connector is reduced in comparison with a cover without the leg design of the present invention. This in turn will reduce the cover assembly force, the cover removal force, prevent damage or scratching of the housing, simplify the retention feature design and save cost on cover material since it may be mode of a reduced thickness and/or lower grade material.

What is claimed is:

1. An electrostatic protection cover for press fitting onto an electrical connector of having at least one array of a plurality of compressive conductive elements defining a contact region, said electrostatic protection cover comprising:

a main body including an, upper section to be positioned adjacent the contact region of said electrical connector and the main body electrically connecting contact sections of the electrical contacts, at least one grounding leg dependent from said main body and positioned therefrom so that a resiliently deflectable portion of said at least one grounding leg can become engaged by at least one conductive element and upon engagement to be deflected from a previously undeflected condition, and clipping means for removably securing said main body to said electrical connector.

2. An electrostatic protection cover as claimed in claim 1 wherein said clipping means includes at least two resilient legs extending from said main body each for engagement with an opposite side of the electrical connector.

3. An electrostatic protection cover as claimed in claim 2 wherein said clipping means includes a further pair of legs extending downwardly from the upper section of said main body to engage with a further pair of legs receiving region of an upper surface of said electrical connector.

4. An electrostatic protection cover as claimed in claim 3 wherein said at least two resilient legs are to locate said main body in a direction lateral to the direction in which said further pair of legs provides location of said main body when viewed in a direction downwardly onto said electrostatic protection cover.

5. An electrostatic protection cover as claimed in claim 2 wherein said at least two resilient legs are downwardly dependent from said main body and have an outwardly splayed (relative to each other) distal end.

6. An electrostatic protection cover as claimed in claim 1 wherein the main body section includes said upper section of a substantially quadrilateral outline and side sections extending from opposed sides of said upper section thereby forming a U-shaped profile.

7. An electrostatic protection cover as claimed in claim 1 wherein a plurality of grounding legs are provided, one for a respective conductive element, and each extending from a said side section in a cantilevered manner each having a fixed end engaged to said side section and a distal end.

8. An electrostatic protection cover as claimed in claim 7 wherein said plurality of grounding legs extend from both said side sections.

9. An electrostatic protection cover as claimed in claim 7 wherein the distal ends of said plurality of grounding legs from both side sections are positioned inwardly of said U-shaped profile.

10. An electrostatic protection cover as claimed in claim 1 wherein said at least one grounding leg is positioned to engage with externally presented contact regions of each said conductive element.

11. An electrostatic protection cover as claimed in claim 6 wherein said side sections are engaged with said upper section at both distal ends of said sides.

12. An electrostatic protection cover as claimed in claim 1 wherein said cover has been formed by bending from a stamped sheet metal material.

13. An electrostatic protection cover as claimed in claim 1 wherein said upper section includes a planar region with which a suction pressure pick-up tool can engage for the machine handling of said connector.

14. An electrical connector of having at least one array of a plurality of conductive elements defining a contact region, the conductive elements located by an insulating housing for providing an electrical connection between electrical circuit traces of two electrical devices wherein said electrical connector has an electrostatic protection cover engaged thereto, to create a short between all conductive elements, said electrostatic protection cover comprising:

a main body including an upper section to be positioned adjacent the contact region of said electrical connector and the main body electrically connected to contact sections of the electrical contacts, at least one grounding leg dependent from said main body in a resiliently deflectable manner, each engaged by an at least one conductive element and biased thereto as a result of having been deflected; and clipping means for removably securing said main body to said electrical connector.

15. A printed circuit board mounting an electrical connector as claimed in claim 1.

* * * * *